United States Patent
Mariani et al.

(10) Patent No.: US 6,593,802 B2
(45) Date of Patent: Jul. 15, 2003

(54) ON-CHIP AUTOMATIC TUNING TECHNIQUE

(75) Inventors: Giorgio Mariani, Phoenix, AZ (US); Valter Orlandini, Phoenix, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/929,192

(22) Filed: Aug. 14, 2001

(65) Prior Publication Data

US 2003/0034811 A1 Feb. 20, 2003

(51) Int. Cl.$^7$ ................................ H04B 1/10
(52) U.S. Cl. .......................... 327/553; 327/344
(58) Field of Search ................... 327/137, 334, 327/336, 344, 345, 553, 555

(56) References Cited

U.S. PATENT DOCUMENTS

| | | | |
|---|---|---|---|
| 4,851,719 A | | 7/1989 | Hitomi |
| 4,882,762 A | * | 11/1989 | Waldhauer ............ 381/106 |
| 5,874,830 A | * | 2/1999 | Baker .................... 323/316 |
| 5,883,545 A | | 3/1999 | Boyd |
| 6,246,351 B1 | * | 6/2001 | Yilmaz ................... 341/136 |

OTHER PUBLICATIONS

"High–Frequency CMOS Continuous–Time Filters," Haideh Khorramabadi and Paul R. Gray, IEEE Journal of Solid–State Circuits, vol. SC–19, No. 6, Dec. 1984.

"An Elliptic Continuous–Time CMOS Filter with On–Chip Automatic Tuning," Mihai Banu and Yannis Tsividis, IEEE Journal of Solid–State Circuits, vol. SC–20, No. 6, Dec. 1985.

* cited by examiner

Primary Examiner—Timothy P. Callahan
Assistant Examiner—Cassandra Cox
(74) Attorney, Agent, or Firm—Lisa K. Jorgenson; William A. Munck

(57) ABSTRACT

A stable, process independent RC time constant for precision frequency response in automatic tuning is generated using a feedback loop employing a voltage controlled resistor to force current through the output node to equal a reference current. The only terms in the expression for the time constant affected by process variations are two resistances, which are uniformly affected by any process variations to maintain proportion. The open loop transfer function for the feedback loop contains only one pole; because no phase-locked loop or other complex circuit introducing multiple poles within the feedback loop are employed, the time constant tuning filter is intrinsically stable.

20 Claims, 2 Drawing Sheets

US 6,593,802 B2

ON-CHIP AUTOMATIC TUNING TECHNIQUE

CROSS-REFERENCE TO RELATED APPLICATIONS

The present application is related to the subject matter within commonly-assigned, copending patent applications entitled "HIGH LINEARITY, LOW POWER VOLTAGE CONTROLLED RESISTOR" Ser. No. 09/929,195 and "ENHANCED FOLDED CASCODE VOLTAGE GAIN CELL" Ser. No. 09/929,194. The content of the above-identified applications is incorporated herein by reference.

TECHNICAL FIELD OF THE INVENTION

The present invention is directed, in general, to tuning circuits and, more specifically, to producing a stable, process independent RC time constant for use in automatic tuning of continuous time filters.

BACKGROUND OF THE INVENTION

Continuous-time filters, such as intermediate frequency (IF) communications filters and video processors, generally require frequency tuning within the filter to match a specified frequency. Existing on-chip automatic tuning techniques typically employ a phase-lock loop (PLL), introducing poles in the feedback loop and therefore creating stability issues.

Additionally, frequency response precision within continuous-time filters is often constrained by RC time constant variances from one circuit to another due to fabrication process tolerances, operating temperature variations, and aging.

There is, therefore, a need in the art for a stable RC time constant within automatic tuning circuits.

SUMMARY OF THE INVENTION

To address the above-discussed deficiencies of the prior art, it is a primary object of the present invention to provide, for use in on-chip automatic tuning, a stable, process independent RC time constant for precision frequency response, generated using a feedback loop employing a voltage controlled resistor to force current through the output node to equal a reference current. The only terms in the expression for the time constant affected by process variations are two resistances, which are uniformly affected by any process variations to maintain proportion. The open loop transfer function for the feedback loop contains only one pole; because no phase-locked loop or other complex circuit introducing multiple poles within the feedback loop are employed, the time constant tuning filter is intrinsically stable.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
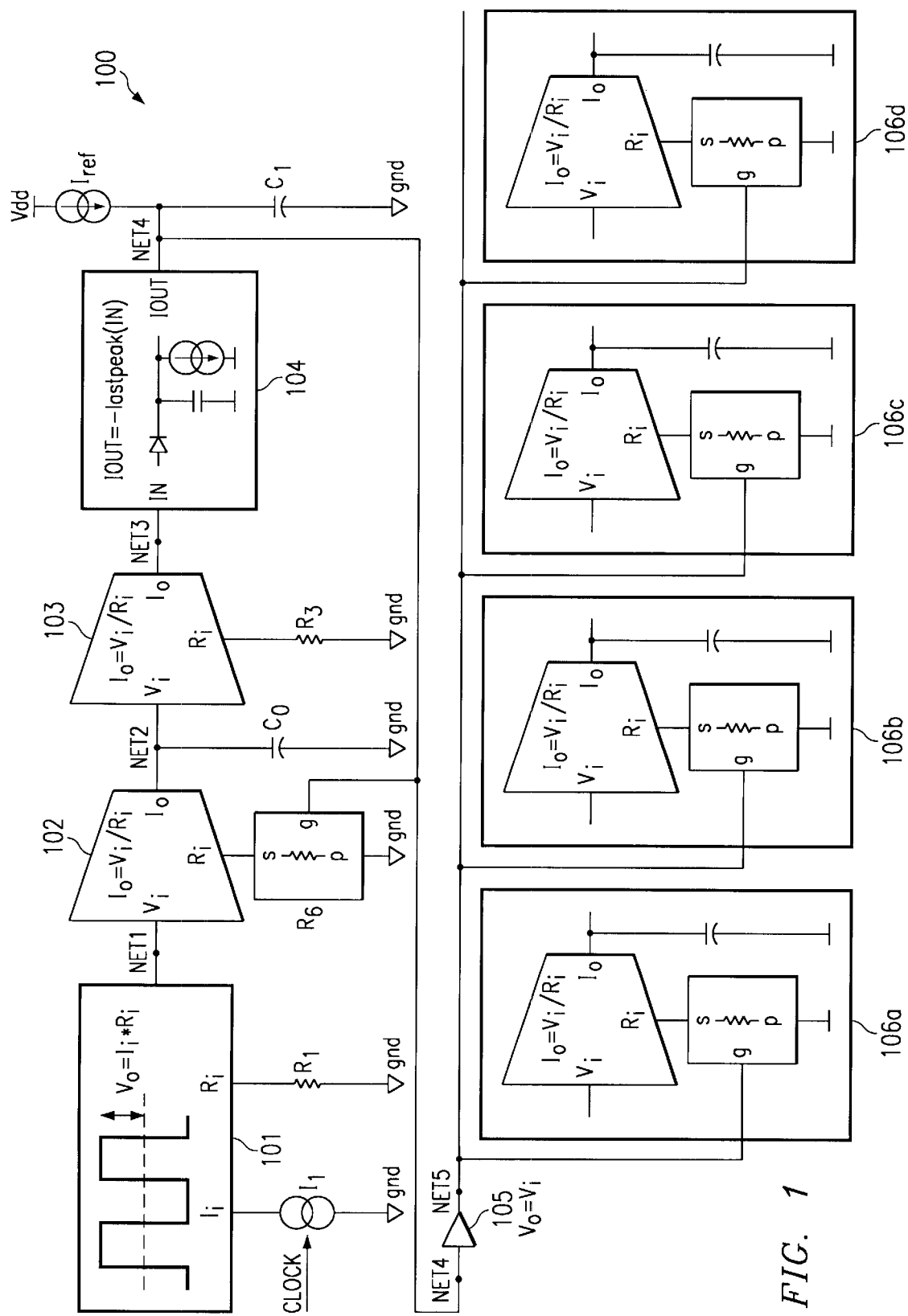
FIG. 1 depicts an RC time constant circuit for use in automatic tuning according to one embodiment of the present invention.
Figure 2:
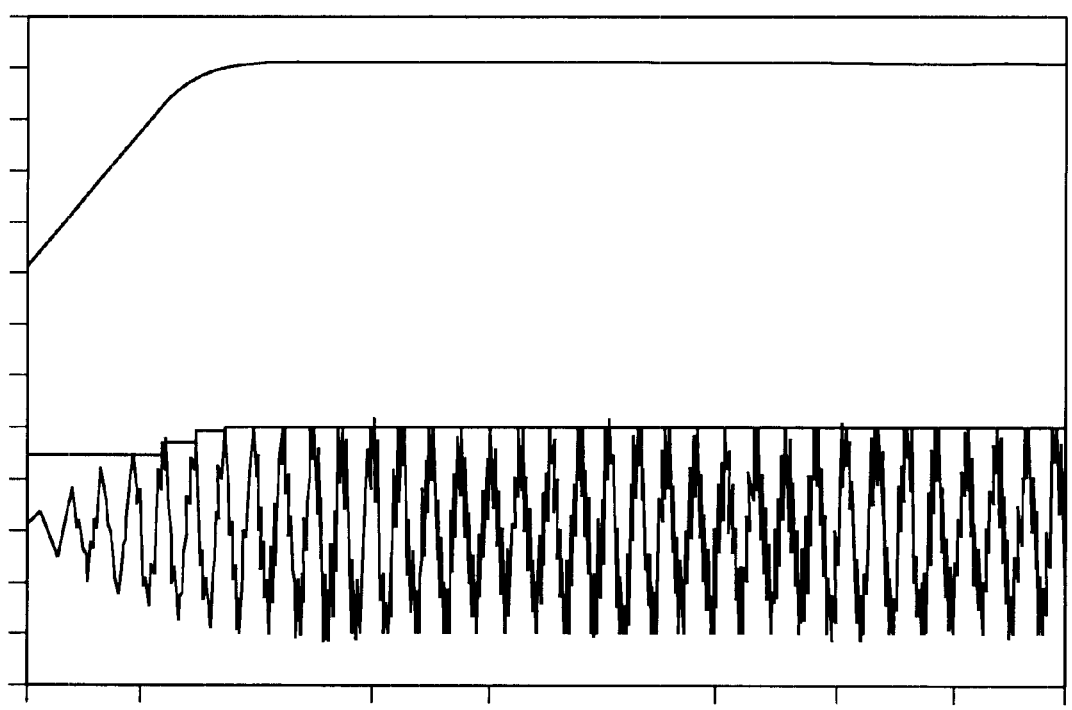
FIG. 2 is a plot of the feedback loop voltage and corresponding input and output currents of a current peak detector within an RC time constant circuit according to one embodiment of the present invention.

FIGS. 1 and 2, discussed below, and the embodiment used to describe the principles of the present invention in this patent document are by way of illustration only and should not be construed in any way to limit the scope of the invention. Those skilled in the art will understand that the principles of the present invention may be implemented in any suitably arranged device.

FIG. 1 depicts an RC time constant circuit for use in automatic tuning according to one embodiment of the present invention. The RC time constant circuit design of the present invention assumes that a stable timer (e.g., a crystal oscillator) and a stable current source are available. Circuit 100 includes a square wave generator 101 taking as an input a current from current source $I_1$ triggered by a stable clock signal CLK and connected between the input terminal $I_i$ of square wave generator 101 and a ground voltage gnd. A resistor $R_1$ is connected between the input terminal $R_i$ of square wave generator and the ground voltage gnd. Square wave generator 101 supplies a square wave having an amplitude equal to the input current from current source $I_1$ times the resistance of resistor $R_1$. The signal at node NET1 is therefore:

$$V_1 = I_i R_i = I_1 R_1. \tag{1}$$

The output of square wave generator 101 is connected to a pair of series-connected voltage-to-current converters 102 and 103. Voltage-to-current converter 102 is connected to node NET1 at an input terminal $V_i$. A voltage-controlled resistor $R_6$ is connected between an input terminal $R_i$ for voltage-to-current converter 102 and the ground voltage gnd. Voltage-controlled resistor $R_6$ is preferably implemented as described in the related application identified above entitled "HIGH LINEARITY, LOW POWER VOLTAGE CONTROLLED RESISTOR" or any kind of variable transconductor such as, for example, a GM-C filter.

The output current from voltage-to-current converter 102 is equal to the input voltage $V_1$ at input terminal $V_i$ divided by the resistance at input terminal $R_i$ of the voltage-to-current converter 102, which in the embodiment depicted is the resistance between terminals d and s of voltage-controlled resistor $R_6$. However, the presence of capacitance $C_0$ connected between node NET2 and the ground voltage gnd will result in a triangular wave voltage signal at node NET2. The peak voltage $VP_2$ of the triangular wave signal at node NET2 is therefore $$VP_2 = \frac{V_1 \cdot T/2}{C_0 \cdot R_6}, \tag{2}$$

where T is the period of the clock signal CLK.

Voltage-to-current converter 103 is the same as voltage-to-current converter 102, producing an ouput current at terminal $I_i$ which is equal to the input voltage at terminal $V_i$ divided by the resistance and input terminal $R_i$. In the embodiment depicted, where the input terminal $I_i$ for voltage-to-current converter 103 is connected to node NET2 and a resistor $R_3$ is connected between terminal $R_i$ and the ground voltage gnd, the peak current $IP_3$ at node NET3 is therefore $$IP_3 = \frac{VP_2}{R_3}. \tag{3}$$

Voltage-to-current converters 102 and 103 are preferably both implemented utilizing the folded cascode voltage gain cell described in the related application identified above entitled "ENHANCED FOLDED CASCODE VOLTAGE GAIN CELL". Those skilled in the art will recognize that the folded cascode voltage gain cell does not comprise the entire voltage-to-current converter.

Node NET3 is connected to the input terminal IN of a current peak detector 104, which is connected, in turn, at an output terminal IOUT to node NET4. Current peak detector 104 sinks current from node NET4 at the output terminal IOUT which is equal to the current at the input terminal IN. The signal at node NET4 may be taken as a voltage conversion of the signal at node NET3 with a (negative, representing a current gain of –1) conversion factor $K_4$:

$$V_4 = K_4 IP_3. \tag{4}$$

It should be noted that the resistance of voltage-controlled resistor $R_6$ is a function $f(V_4)$ of the voltage $V_4$ at node NET4:

$$R_6 = f(V_4),$$

with the resistance decreasing monotonically as the voltage $V_4$ increases.

By combining the above equations (1)–(4), the current sunk at the output terminal IOUT of current peak detector 104 may be expressed as:

$$IOUT = \frac{I_1 \cdot R_1 \cdot T/2}{R_3 \cdot R_6 \cdot C_0}. \tag{5}$$

Since a stable time constant $\tau = R_6 C_0$ is desired from RC time constant circuit 100, equation (5) may be rewritten as:

$$\tau = R_6 \cdot C_0 = \frac{I_1 \cdot R_1 \cdot T/2}{R_3 \cdot IOUT} = \frac{I_1 \cdot R_1 \cdot T/2}{R_3 \cdot I_{ref}}. \tag{6}$$

The time constant $\tau$ is therefore stable because the loop from node NET4 through the voltage-controlled resistor $R_6$ to voltage-to-current converter 102 forces the current at the output terminal IOUT of current peak detector 104 to be the same as the current produced by current source $I_{ref}$. Moreover, the RC time constant circuit 100 is fabrication process independent since process variations will have the same effect on both resistors $R_1$ and $R_3$, which are the only two terms within equation (6) affected by process variations.

The voltage at node NET4 is employed to drive other voltage-controlled resistors implemented in the same manner as resistor $R_6$ in other part of an integrate circuit in order to keep all RC time constants consistent. In the embodiment depicted, a voltage buffer 105 is employed to receive the voltage at node NET4 and drive that same voltage, through node NET5, to the control terminals of voltage-controlled resistors within a plurality of integrated circuit cells 106a–106d. Each cell 106a–106d includes a capacitance used together with the voltage-controlled resistance to generate a time constant pole and/or zero.

The feedback loop of the RC time constant circuit 100 in the present invention does not include a complex phase-locked loop. Because the open-loop transfer function contains only 1 pole (due to the capacitor $C_1$ connected to node NET4), circuit 100 is intrinsically stable, such that no need exists to consider issues regarding instability of the feedback loop.

FIG. 2 is a plot of the feedback loop voltage and corresponding input and output currents of a current peak detector within an RC time constant circuit according to one embodiment of the present invention. The upper plot depicted is the voltage at node NET4 within circuit 100, while the lower plot depicts the input current (triangular waveform trace) at terminal IN of current peak detector 104 and the output current (stepped/steady state trace) sunk at the output terminal IOUT of current peak detector 104. After the initial transition, the circuit 100 reaches stable biasing without problem.

Although the present invention has been described in detail, those skilled in the art will understand that various changes, substitutions, and alterations herein may be made without departing from the spirit and scope of the invention in its broadest form.

What is claimed is:

1. For use in automatic tuning, a time constant circuit for generating a stable resistive-capacitive time constant comprising:

a capacitance;

a voltage-controlled resistance;

a voltage-to-current converter driving an output current into a node coupled to the capacitance, the output current related to the voltage-controlled resistance; and a current peak detector coupled between the voltage-to-current converter and an output node, the current peak detector sinking a current equal to a reference current during steady-state operation, wherein the output node is connected to and sets a resistance value for the voltage-controlled resistance.

2. The time constant circuit as set forth in claim 1 wherein the voltage-controlled resistance is connected between a resistance terminal of the voltage-to-current converter and a ground voltage within a feedback loop from the output node.

3. The time constant circuit as set forth in claim 1 further comprising:
a second voltage-to-current converter coupled between the node coupled to the capacitance and the current peak detector, wherein the second voltage-to-current converter drives a current into the current peak detector related to a first fixed resistance.

4. The time constant circuit as set forth in claim 3 further comprising:
a square wave generator producing a input voltage signal received by the voltage-to-current converter driving the output current into the node coupled to the capacitance, an amplitude of the input voltage signal related to a second fixed resistance.

5. The time constant circuit as set forth in claim 4 wherein a resistive-capacitive time constant for the time constant circuit depends on no process-dependent terms other than the first and second fixed resistances.

6. The time constant circuit as set forth in claim 5 wherein the resistive-capacitive time constant equals
a product of
a current $I_1$ received by the square wave generator,
the second fixed resistance $R_1$,
half a period T of the input voltage signal
divided by a product of
the reference current $I_{ref}$ and
the first fixed resistance $R_3$.

7. The time constant circuit as set forth in claim 1 wherein the output node sets a resistance value for other voltage-controlled resistances within an integrated circuit containing the time constant circuit.

8. An automatic tuning circuit comprising:
one or more voltage-controlled resistors within a filter;
a time constant circuit for generating a stable resistive-capacitive time constant controlling a resistance of the voltage-controlled resistors comprising:
a capacitance;
a voltage-controlled resistance;
a voltage-to-current converter driving an output current into a node coupled to the capacitance, the output current related to the voltage-controlled resistance; and
a current peak detector coupled between the voltage-to-current converter and an output node, the current peak detector sinking a current equal to a reference current during steady-state operation,
wherein the output node is connected to and sets a resistance value for the voltage-controlled resistance.

9. The automatic tuning circuit as set forth in claim 8 wherein the voltage-controlled resistance is connected between a resistance terminal of the voltage-to-current converter and a ground voltage within a feedback loop from the output node.

10. The automatic tuning circuit as set forth in claim 8 further comprising:
a second voltage-to-current converter coupled between the node coupled to the capacitance and the current peak detector, wherein the second voltage-to-current converter drives a current into the current peak detector related to a first fixed resistance.

11. The automatic tuning circuit as set forth in claim 10 further comprising:
a square wave generator producing a input voltage signal received by the voltage-to-current converter driving the output current into the node coupled to the capacitance, an amplitude of the input voltage signal related to a second fixed resistance.

12. The automatic tuning circuit as set forth in claim 11 wherein a resistive-capacitive time constant for the time constant circuit depends on no process-dependent terms other than the first and second fixed resistances.

13. The automatic tuning circuit as set forth in claim 12 wherein the resistive-capacitive time constant equals
a product of
a current $I_1$ received by the square wave generator,
the second fixed resistance $R_1$, and
half a period T of the input voltage signal
divided by a product of
the reference current $I_{ref}$ and
the first fixed resistance $R_3$.

14. The automatic tuning circuit as set forth in claim 8 wherein the output node sets a resistance value for the one or more voltage-controlled resistors.

15. For use in automatic tuning, a method of producing a resistive-capacitive time constant comprising:
driving an output current from a voltage-to-current converter into a node coupled to a capacitance, wherein the output current is related to a voltage-controlled resistance; and
sinking a current at an output node equal to a reference current during steady-state operation,
wherein the output node is connected to and sets a resistance value for the voltage-controlled resistance.

16. The method as set forth in claim 15 wherein the step of driving an output current from a voltage-to-current converter into a node coupled to a capacitance further comprises:
setting the voltage-controlled resistance using a feedback loop from the output node, wherein the voltage-controlled resistance is connected between a resistance terminal of the voltage-to-current converter and a ground voltage within the feedback loop.

17. The method as set forth in claim 15 further comprising:
driving a current related to a first fixed resistance into a current peak detector coupled to the output node using a second voltage-to-current converter coupled between the node coupled to the capacitance and the current peak detector.

18. The method as set forth in claim 17 further comprising:
producing a input voltage signal received by the voltage-to-current converter driving the output current into the node coupled to the capacitance, an amplitude of the input voltage signal related to a second fixed resistance.

19. The method as set forth in claim 18 further comprising:
generating a resistive-capacitive time constant which depends on no process-dependent terms other than the first and second fixed resistances.

20. The method as set forth in claim 19 wherein the step of generating a resistive-capacitive time constant which depends on no process-dependent terms other than the first and second fixed resistances further comprises:
producing a resistive-capacitive time constant equaling
a product of
a current $I_1$ received by the square wave generator,
the second fixed resistance $R_1$, and
half a period T of the input voltage signal
divided by a product of
the reference current $I_{ref}$ and
the first fixed resistance $R_3$.

* * * * *